United States Patent
Glazer et al.

(10) Patent No.: US 7,253,120 B2
(45) Date of Patent: Aug. 7, 2007

(54) SELECTABLE AREA LASER ASSISTED PROCESSING OF SUBSTRATES

(75) Inventors: Arie Glazer, Mevaseret Zion (IL); Abraham Gross, Ramat Aviv (IL)

(73) Assignee: Orbotech Ltd., Yavne (IL)

( * ) Notice: Subject to any disclaimer, the term of this patent is extended or adjusted under 35 U.S.C. 154(b) by 129 days.

(21) Appl. No.: 10/694,392

(22) Filed: Oct. 28, 2003

(65) Prior Publication Data

US 2004/0137731 A1 Jul. 15, 2004

Related U.S. Application Data

(60) Provisional application No. 60/421,555, filed on Oct. 28, 2002.

(51) Int. Cl.
*H01L 21/22* (2006.01)
*B23K 26/00* (2006.01)

(52) U.S. Cl. ............... 438/758; 438/705; 438/766; 216/62; 216/87; 219/121.73; 219/121.78; 219/121.85

(58) Field of Classification Search ............ None
See application file for complete search history.

(56) References Cited

U.S. PATENT DOCUMENTS

| | | | |
|---|---|---|---|
| 5,302,798 A * | 4/1994 | Inagawa et al. | 219/121.7 |
| 5,541,138 A * | 7/1996 | Yamazaki et al. | 438/535 |
| 5,620,910 A * | 4/1997 | Teramoto | 438/151 |
| 5,871,826 A | 2/1999 | Mei et al. | |
| 5,938,839 A * | 8/1999 | Zhang | 117/104 |
| 6,335,509 B1 | 1/2002 | Jung | |
| 6,491,361 B1 * | 12/2002 | Spann | 347/2 |
| 6,573,531 B1 | 6/2003 | Im et al. | |
| 6,727,121 B2 * | 4/2004 | Joo et al. | 438/149 |
| 2003/0019854 A1 | 1/2003 | Gross et al. | |
| 2003/0141503 A1 | 7/2003 | Lee | |
| 2003/0194509 A1 * | 10/2003 | Downey | 427/569 |
| 2004/0196559 A1 * | 10/2004 | Lissotschenko | 359/619 |
| 2005/0056626 A1 | 3/2005 | Gross et al. | |

FOREIGN PATENT DOCUMENTS

WO      WO 03071344        8/2003
WO      WO 2003071344 A1 *  8/2003

OTHER PUBLICATIONS

EC Jones and E. Ishida, "Shallow Junction Doping Technologies for ULSI," *Mat. Sci. Eng. Reports R24,* # 1-2, 1, pp. 1-80, Oct. 1998.

* cited by examiner

*Primary Examiner*—Anita Alanko
(74) *Attorney, Agent, or Firm*—Sughrue Mion, PLLC

(57) ABSTRACT

A system and method for selectable area laser treatment of a substrate, such as thin film transistors, the system including a holder holding a substrate in proximity to reactant, and laser beams each addressing independently selectable mutually set apart locations on the substrate to induce a reaction between the substrate and the reactant.

36 Claims, 3 Drawing Sheets

SELECTABLE AREA LASER ASSISTED PROCESSING OF SUBSTRATES

This application claims the benefit of U.S. Provisional Patent Application No. 60/421,555, titled "Selectable Area Laser Assisted Thermal Processing of TFT Substrates" filed on Oct. 28, 2002, the disclosure of which is incorporated by reference in its entirety.

BACKGROUND OF THE INVENTION

1. Field of the Invention

The present invention generally relates to systems and methods applicable to selectable area laser assisted processing of substrates, such as Thin Film Transistor (TFT) layers on glass substrates, and more particularly to systems and methods suitable for use in the production of thin film transistor arrays and other electronic components found in electronic devices, such as flat panel displays.

2. Description of Related Arts

The formation of semiconductor electronic components typically entails numerous processing steps, one of which is doping whereby an impurity is introduced into the crystalline structure of a semiconductor substrate such as silicon. Lasers have been found to be an effective tool in doping processes. They also appear to be useful in other processes requiring the inducement of a reaction between two materials. Conventional methodologies using lasers in doping processes require photo-masks, which tend to be expensive and unwieldy.

SUMMARY OF INVENTION

To solve the above-described problem, it is an aspect of the present invention to provide improved systems and methods for laser processing of semiconductor materials, useful for example in the manufacture of thin film transistors.

The present invention seeks to provide improved laser systems and methods for inducing a reaction between different materials.

The present invention further seeks to provide improved systems and methods for forming thin film transistors on substrates.

The present invention further seeks to provide improved systems and methods for laser impurity doping and/or laser assisted diffusion of impurity atoms in arrays of thin film transistors.

In accordance with an aspect of the invention, a method of causing a first material to react with a second material includes placing a first material in close proximity to a second material and delivering a laser beam to a plurality of independently selectable locations on the second material thereby to induce a reaction between the first material and second material at the independently selectable locations. The first material is, for example, a gas containing impurity atoms, and the second material is, for example, a semiconductor substrate immersed in the gas.

In accordance with another aspect of the invention, a method of doping semiconductors includes immersing a semiconductor substrate in a dopant, and delivering a laser beam to a plurality of independently selectable locations on said semiconductor substrate thereby to induce a reaction between the dopant and the semiconductor substrate at the independently selectable locations thereon.

In accordance with another aspect of the invention, a method of fabricating thin film transistors, includes forming at least one conductive film on a substrate, immersing the substrate in a dopant, and delivering a laser beam to a plurality of independently selectable locations on the substrate to induce a reaction between the dopant and the conductive film at the independently selectable locations.

In accordance with another aspect of the invention, a laser processing apparatus, includes a holder configured to hold a first material in proximity to a second material, and a laser beam delivery system operative to deliver a plurality of laser beams to independently selectable locations on the second material thereby to induce a reaction between the first material and the second material at the independently selectable locations.

In accordance with another aspect of the invention, a method of producing thin film transistors on a substrate includes generating a laser beam; splitting the laser beam into a plurality of selectably positionable sub-beams; and directing each of the plurality of sub-beams to selectable areas on the substrate where the transistors are to be formed in the presence of a doping gas to induce a reaction between the substrate and the doping gas at the selectable areas.

In accordance with another aspect of the invention, a method of producing thin film transistors on a substrate includes generating a pulsed laser beam; modulating the pulsed laser beam; and scanning the pulsed laser beam to deliver pulsed laser energy to selectable areas on the substrate where the transistors are to be formed in the presence of a doping gas to induce a reaction between the substrate and the doping gas at the selectable areas.

In accordance with another aspect of the invention, a thin film transistors formation system includes a laser generating at least one laser beam; a laser beam director directing the laser beams to selectable locations on a substrate in contact with a reactant, wherein the laser beams are independently guided. The laser beams may be independently steered to selectable locations by beam steering elements. Optionally, the beam may be scanned and modulated so that laser energy is delivered only to selected locations.

In accordance with another aspect of the invention a method of manufacturing an array of thin film transistors includes applying an undercoat of amorphous silicon to a substrate; forming silicon islands by lithographic masking and etching; crystallizing the amorphous silicon islands by laser treating said silicon islands at a plurality of independently selectable locations whereat thin film transistors are to be formed; and doping PMOS and NMOS channels by applying a laser beam to selectable locations on said silicon islands in the presence of a suitable dopant. Additional operations include: dehydrogenating amorphous silicon prior to crystallization by laser treatment; forming dielectric gates; hydrogenating additional selectable areas by laser treatment; and doping PMOS and NMOS source/drains by laser treatment at selectable areas in the presence of a suitable dopant.

BRIEF DESCRIPTION OF DRAWINGS

The present invention will be understood and appreciated more fully from the following detailed description of illustrative, non-limiting embodiments with reference to the accompanying drawings in which.

DETAILED DESCRIPTION

The present invention will now be taught by describing illustrative, non-limiting embodiments thereof with reference to the accompanying drawings.

Figure 1:
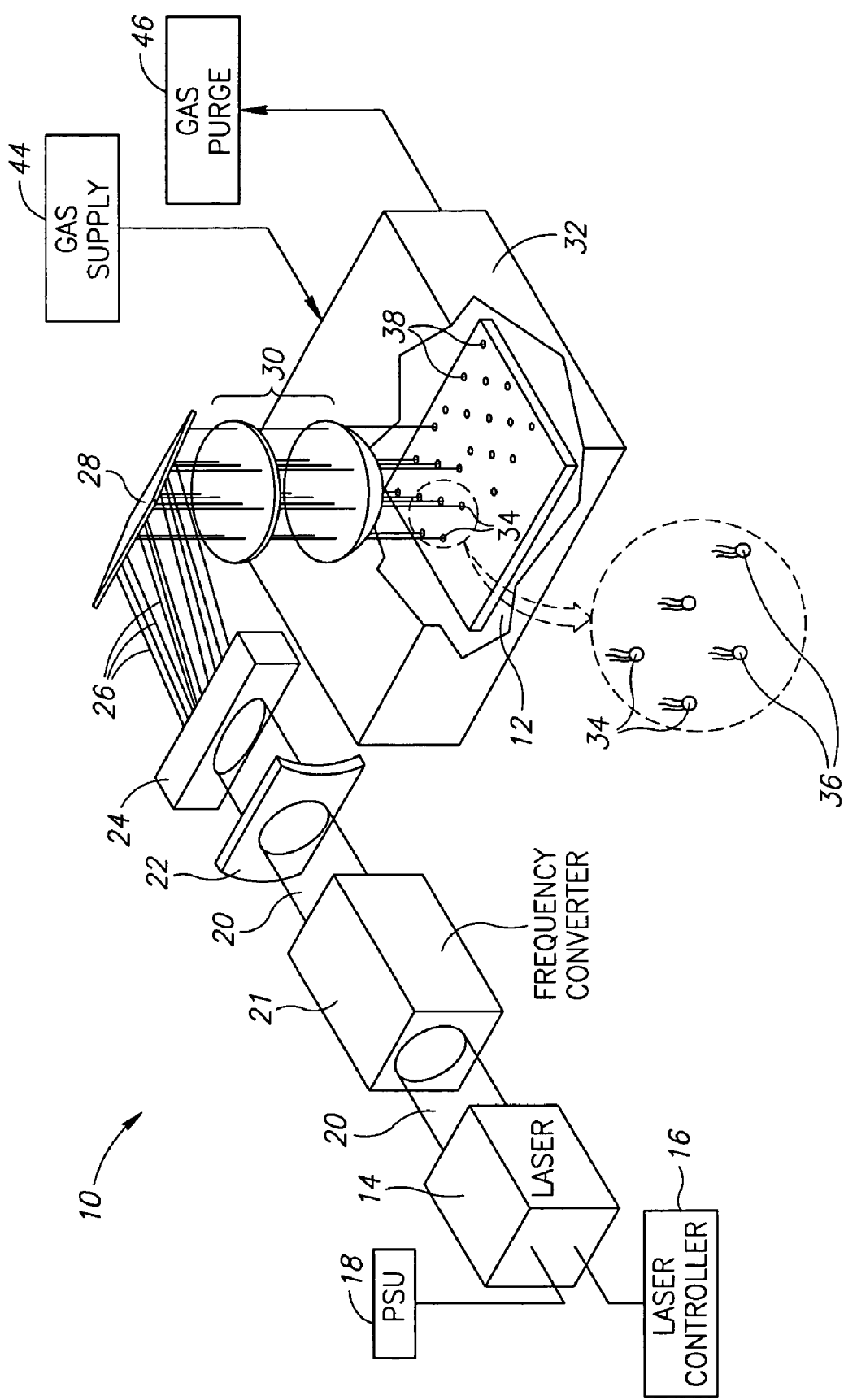
FIG. 1 shows a simplified pictorial illustration of a system for thermal processing of silicon structures formed on a substrate in accordance with an embodiment of the invention.

FIG. 1 is a simplified pictorial illustration of a system 10 for laser processing silicon formations on a substrate 12 in accordance with an illustrative, non-limiting embodiment of the invention. Such treatment may include, for example, annealing, crystallization of amorphous silicon to form crystalline poly-silicon, dehydrogenation, ion doping, ion diffusion, hydrogenation, doping activation and like processes in which energy is delivered to a plurality of localized regions of a substrate to facilitate the processing of TFTs.

System 10 includes a laser 14, controlled by a laser controller 16. In the embodiment of the invention seen in FIG. 1, laser 14 is associated with a pulse supply unit (PSU) 18, such as a Q-switch, to output a pulsed laser beam 20. Optionally, the laser 14 may be a mode-locked laser outputting a mode-locked pulsed laser beam. In the embodiment of FIG. 1, beam 20 is first passed through a frequency converter 21, such as one or more non-linear crystals, and then through optics, schematically represented by a beam shaping lens 22, to impinge on a beam controller 24 operative control a beam output delivered to a substrate. In accordance an embodiment the invention, controller 24 comprises one or more of beam splitter operative to split beam 20 into a plurality of sub-beams 26. Optionally, controller 24 comprises a modulator and a scanner operative to modulate beam 20 and scan the modulated beam.

In an embodiment seen in FIG. 1, beam 20 is split into a plurality of sub-beams 26, each of which exits controller 24 at a suitable angular orientation so as to impinge on a beam redirecting unit, depicted as a reflector 28. Reflector 28 is operative to direct the beams to a given location on the surface of substrate 12. Reflector 28 may comprise, for example, a plurality of spatial oriented mirrors (not shown) and/or a set of directional steering elements (not shown) operative to provide further directional control for each sub-beams 26.

In accordance with a particular embodiment of the invention, generally in accordance with teachings of micro-machining systems employed to form holes in substrates shown and described in co-pending patent application Ser. No. 10/170,212, filed Jun. 13, 2002 for a "Multiple Beam Micro-Machining System", the disclosure of which is incorporated in its entirety, reflector 28 includes a 2-dimensional mapping assembly downstream of the controller 24 operative to receive sub-beams 26 all propagating in a plane, and to redirect the sub-beams 26 to a two dimensional array of locations outside the plane. Reflector 28 further includes a variable deflector assembly formed of a plurality of independently tiltable beam steering reflector elements (not shown), such as reflector elements spatially controlled by piezoelectric controllers or reflector elements associated with an optical MEMs device.

Optionally, angle expanding optics (not shown) are interposed between the controller 24 and reflector 28. In accordance with an embodiment of the invention sub-beams 26 are formed.

Downstream of the reflector 28, sub-beams 26 are passed through additional optics 30, including, for example a focusing lens and a telecentric imaging lens, to impinge on the surface of substrate 12 at each of a plurality of localized regions 34. Optionally, a focus parameter of each of the sub-beams 26 is independently controlled, for example as described in greater detail in copending U.S. patent application Ser. No. 10/660,730 titled "Multiple Beam Micro-Machining System and Method" filed Sep. 12, 2003.

It is appreciated that although the present description is generally made with reference to a multiple beam processing system, in the alternative beam 20 may be modulated at controller 24 and the modulated beam may be then scanned across a target surface, for example using a rotating polygon scanner. When using such structure, the delivery of laser energy to selected locations may be controlled, for example, by changing the rotational velocity of the rotating polygon, and/or by suitably modulating the scanned beam, for example using an acousto-optical or other suitable modulator. In accordance with a particular embodiment of the invention, the rotational velocity of the polygon and the pulse rate are synchronized to deliver each laser pulse to a location in an array of locations, for example locations corresponding to TFFs in a flat panel display. Laser scanner devices are well known for delivering radiant energy to a target surface. One example of a laser scanner operative to scan a mode-locked pulsed laser beam, that may be suitably adapted for use in the present invention, is the DP-100SL commercially available from Orbotech Ltd., of Yavne, Israel.

It is preferable that two different materials are in close proximity to each other such that delivery of laser energy to a location on the target surface will induce a reaction between the materials. The two materials may each be in the same physical state, for example two solids in contact with each other. Alternatively the two materials may be in different physical states, for example a solid immersed in a liquid or gas. In FIG. 1, for example, it is seen that system 10 includes a gas immersion chamber 32, including a gas supply unit 44 and a gas purge unit 46. At least some processing of substrate 12 with sub-beams 26 is performed in the gas immersion chamber 32 under suitable gas immersion environmental conditions such that substrate 12 is in contact with a gaseous dopant. Thus, for example, a semiconductor may be laser treated while immersed in a gas environment containing a suitable doping gas.

Sub-beams 26 are each directed to impinge on substrate 12 at selectable locations 34. Each location 34 typically comprises a localized silicon formation (not seen). The substrate 12 or a silicon formation thereon, is laser treated at each location of impingement, seen by waves 36, as shown in FIG. 1. An energy characteristic of laser beams delivered to the surface of substrate 12 may be controlled using various methods known in the art, for example by controlling the fluence of each of sub-beams 26, by controlling the pulse rate of beam 20, by governing the quantity of pulses impinging on substrate 12, by varying the shape of the sub-beams, by attenuating one or more of the beams and/or by spatial distribution of all light pulses developed to a specific feature. The energy characteristic may be changed for all beams so that energy delivery to all locations on a substrate is uniform. Optionally, an energy characteristic may be modulated on the fly such that laser energy is delivered to substrate 12 non-uniformly. In such configuration, a beam having a first desired energy characteristic is delivered to a first location, while a beam having a different energy characteristic is delivered to a subsequent location. This configuration may be useful, for example, in generating transistors that requiring different degrees of doping.

In accordance with an embodiment of the invention, system 10 is operative to laser process localized portions of a layer of amorphous silicon deposited on the surface of substrate 12 so as to form localized poly-silicon crystals at each location 24. Laser processing to anneal localized portions of an amorphous thin film semiconductor layer, resulting in silicon crystallization, is described in further detail in copending PCT patent application Ser. No. WO03071344, titled "Method for Manufacturing Flat Panel Display Substrates" published on Aug. 28, 2003.

In accordance with another embodiment of the invention, a gas provided by gas supply 44 is introduced into chamber 32 in such a way that the substrate 12 is immersed in the gas, and sub-beams 26 are directed to impinge on the surface of the substrate 12 at selectable locations. At the end of a treatment cycle, the gas is purged from chamber 32 by a gas purge unit 46.

It is noted that because each of sub-beams 26 is configured to deliver energy to independently selectable locations, at least some of the laser processing steps may be performed in the same chamber, without masks and without removing substrate 12 from the chamber 32. For example, by changing the chamber 32 ambient gases composition from a carrier of one dopant to another, and optionally varying the size and/or the spacing between locations whereat laser energy is delivered, different steps in a doping process may be carried out without changing masks and without removing the substrate from the chamber 32.

During laser treatment, a suitable gas may be introduced into chamber 32 and sub-beams 26 may be directed to suitable sub-locations of locations 34 to dope PMOS channels. Thereafter, the gas present in chamber 32 may be purged and replaced with a different gas, and sub-beams 26 may be directed to other suitable sub-locations of locations 34 to dope NMOS channels. In accordance with an illustrative, non-limiting embodiment of the invention, suitable gases for doping crystallized silicon on a substrate situated in chamber 32 include, without limitation: $PF_3$, $PF_5$, $BE_3$, $AsF_5$, $B_2H_6$ and $PH_3$.

It is noted that doping processes in chamber 32 may be accomplished in a single laser assisted ion doping step in which a semiconductor substrate is heated to a melting or near melting point at a selectable location, the occurrence of such melting (or near melting) induces a reaction with the dopant gas, for example, ion implantation and uniform distribution in the localized melt. Alternatively, doping is performed in multi-step process including a first ion implantation step, and then a laser assisted dopant drive-in step and/or dopant activation accomplished by further irradiating deposited ions with one or more sub-beams 26. It is appreciated that the radiation requirements of each operation may differ and that it is necessary to change an energy property of laser beams delivered to various different selectable locations.

In some of the illustrative embodiments of the present invention, laser 14 employed to selectively irradiate substrate 12 is a non-excimer pulsed laser. Such lasers typically have a power output that is substantially less than a typical excimer laser employed in industrial applications such as semiconductor or flat panel display fabrication. Consequently, the process of selectively thermally treating substrate 12, in accordance with an embodiment of the invention, directs laser beams substantially to those selectable locations 34 whereat it is desired to perform a laser treatment process, and not to other locations on substrate 12. Typically, the selectable locations are not in contact with each other or are otherwise isolated.

Typically, laser processing is performed substantially exclusively at those locations where transistors are needed in an electrical device to be manufactured on the substrate 12, and not at other locations. Such crystals generally occupy between 0.1%-5%, of the surface of substrate 12, and typically about 1% of the surface. In accordance with an illustrative embodiment of the invention, a single beam or many sub-beams 10 to 2000, and preferable about 250 independently positionable sub-beams 26, are formed and directed to substrate 12. As noted above, in accordance with an embodiment of the invention a laser outputs a single beam, which is modulated and scanned to contact desired selectable locations.

The inventors have found that a frequency converted Q switched or mode locked laser, outputting a beam which is the product of third harmonic generation of a nd:YAG solid state laser, is suitable for use in system 10. Suitable lasers 14 emit pulses at a pulse repetition rate in the range of 5-100 KHz or over 20 MHz, and typically about 80 MHz, in the case of the mode locked laser, with a duty cycle in the range of 1:100-1:10,000. The average power associated with such suitable lasers is less than about 50 W. Typically, the power is in the range of between 5 W to 10 W, although the power of suitable lasers currently under development may reach as high as 15 W or higher.

A commercially available laser believed to meet the requirements, and to include both laser 14 and frequency converter 21 as an integral unit, is the AVIA™ laser available from Coherent, Inc. of Calif. U.S.A. Lasers such as the AVIA™ laser output an approximately 7.5 W average power pulsed frequency converted UV laser beam at 355 nm. The beam has a repetition rate of about 30 KHz, and a pulse width in the range of about 35-100 nsec. It is appreciated that any other suitable solid state, gas or semiconductor pulsed non-excimer laser may be used. Likewise, other suitable forms of frequency conversion, may be employed.

In the embodiment seen in FIG. 1, optics 22 are employed to suitably expand and shape beam 20 so that it impinges on beam splitter 24 such that the beam is divided into a plurality of sub-beams 26, each of which is emitted so as to impinge on reflector 28 and downstream thereof on the surface of substrate 12 at a selectable location. Optics 22 may include a single optical component or multiple optical components. The optical components may be any combination of spherical, cylindrical, aspherical, holographic or other suitable optical components as known in the art of optical design.

Controller 24 may be any suitable beam splitter, such as, for example, an array of suitable diffractive elements. It is appreciated that because a typical electronic device may include as many as several million thin film transistors, since typically up to only about 200-250 locations 34 are addressable at a given time, a displacer (not shown) is provided to move substrate 12 and system 10 relative to each other, as known in the art. The displacer enables thermal treatment of locations 34 disposed on an entire substrate 12.

The choice of the number of sub-beams 26 into which beam 20 is to be divided is a matter of design choice. The choice is functionally related to the desired energy density at which a sub-beam is to be delivered to each of locations 34. Likewise, the energy characteristics of sub-beams 26 may be modified by modifying the pulse rate of beam 20 or by applying conventional beam attenuation or by special amplitude modulation means provided by laser electronics.

Figure 2:
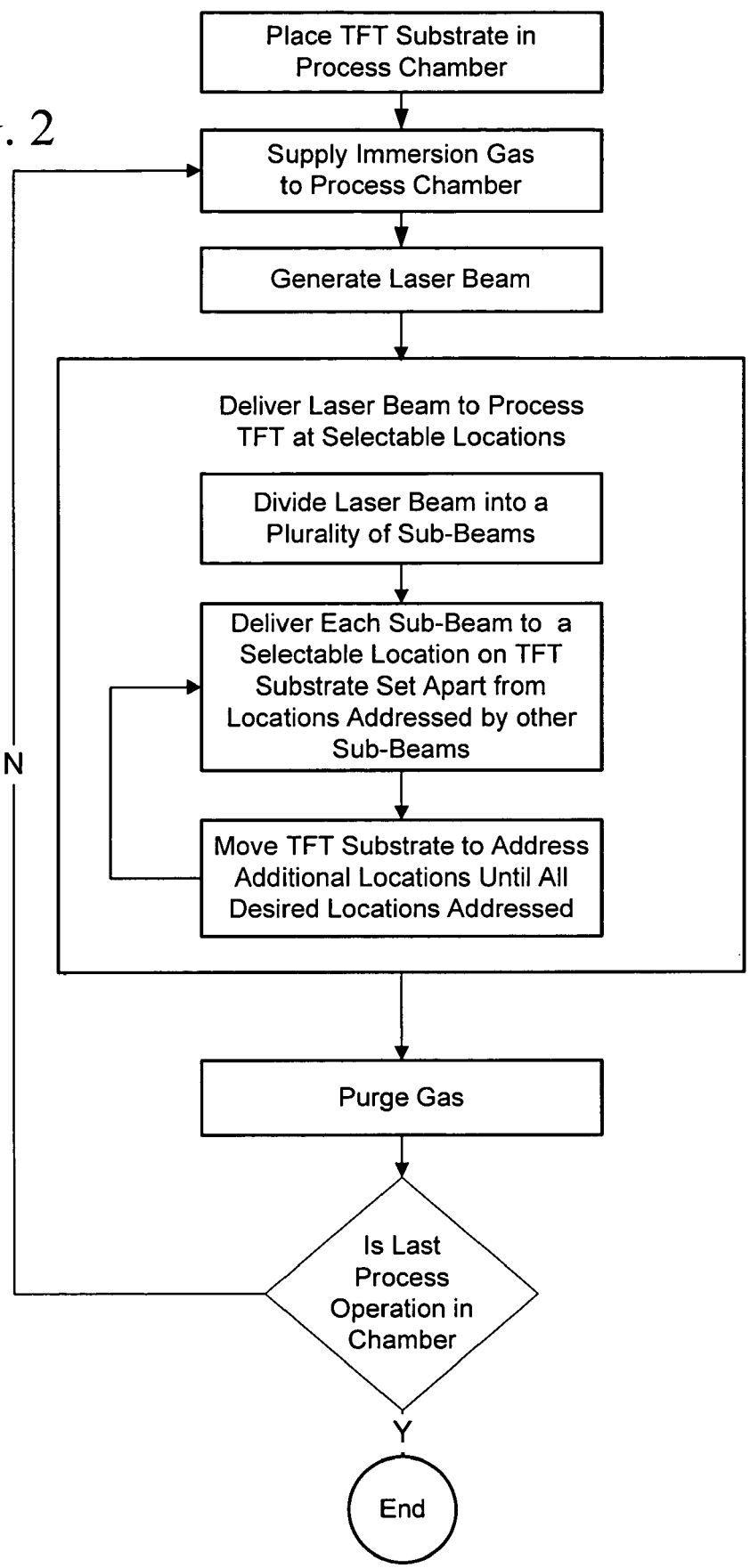
FIG. 2 is a simplified flow chart of a method for processing a substrate employing the system of FIG. 1.

Reference is now made to FIG. 2 which is a simplified, illustrative flow chart of a method for laser treating a substrate, such as a TFT substrate, employing the system of FIG. 1. The laser treating in accordance with the process seen in FIG. 2 may be any suitable laser treatment to induce a reaction, for example doping, between two materials at a multiplicity of selectable and/or non-contiguous locations. The method seen in FIG. 2 commences with placing a substrate onto which thin film transistors (TFT) are to be formed in a process chamber. A gas used in a TFT production process operation is supplied to the process chamber so that a gaseous dopant comes into close proximity or contact with the TFT substrate. A laser beam, for example a Q-switched solid state laser in combination with one or more non-linear crystals suitable for third harmonic generation is generated and delivered to a multiplicity of selectable locations on the substrate.

Delivery of a laser beam to a multiplicity of selectable locations may be accomplished by passing the laser passed through a suitable beam splitter operative to divide the laser beam into a plurality of sub-beams. In accordance with an embodiment of the invention, at least some of the sub-beams are each delivered to impinge on the surface of the TFT substrate cause the TFT to melt, or nearly melt, at a multiplicity of selectable locations. Each of the locations addressed by a sub-beam is at least partially isolated from locations addressed by other sub-beams. As necessary, the TFT substrate is moved, and the operation of delivering sub-beams is repeated until all of the desired locations on the TFT substrate are addressed.

Once all of the locations requiring thermal treatment are addressed in a given gaseous environment, the gas is purged from the process chamber. If an additional laser processing step is required under a different environmental condition, a different gas is supplied to the process chamber, and the delivery of sub-beams is repeated. Typically, there will be a difference in the position and/or size of the various locations addressed under the various environmental conditions. This difference in position and/or size of the various locations corresponds to the respective sizes and locations of crystallized silicon forming a base for thin film transistors, as well of the respective size and position of PMOS channels, NMOS channels, PMOS source/drains and NMOS source/drains associated with the thin film transistors. In accordance with an embodiment of the invention, these differences are accommodated by steering beams to different selectable locations, or by suitably modulating a scanned beam.

Figure 3:
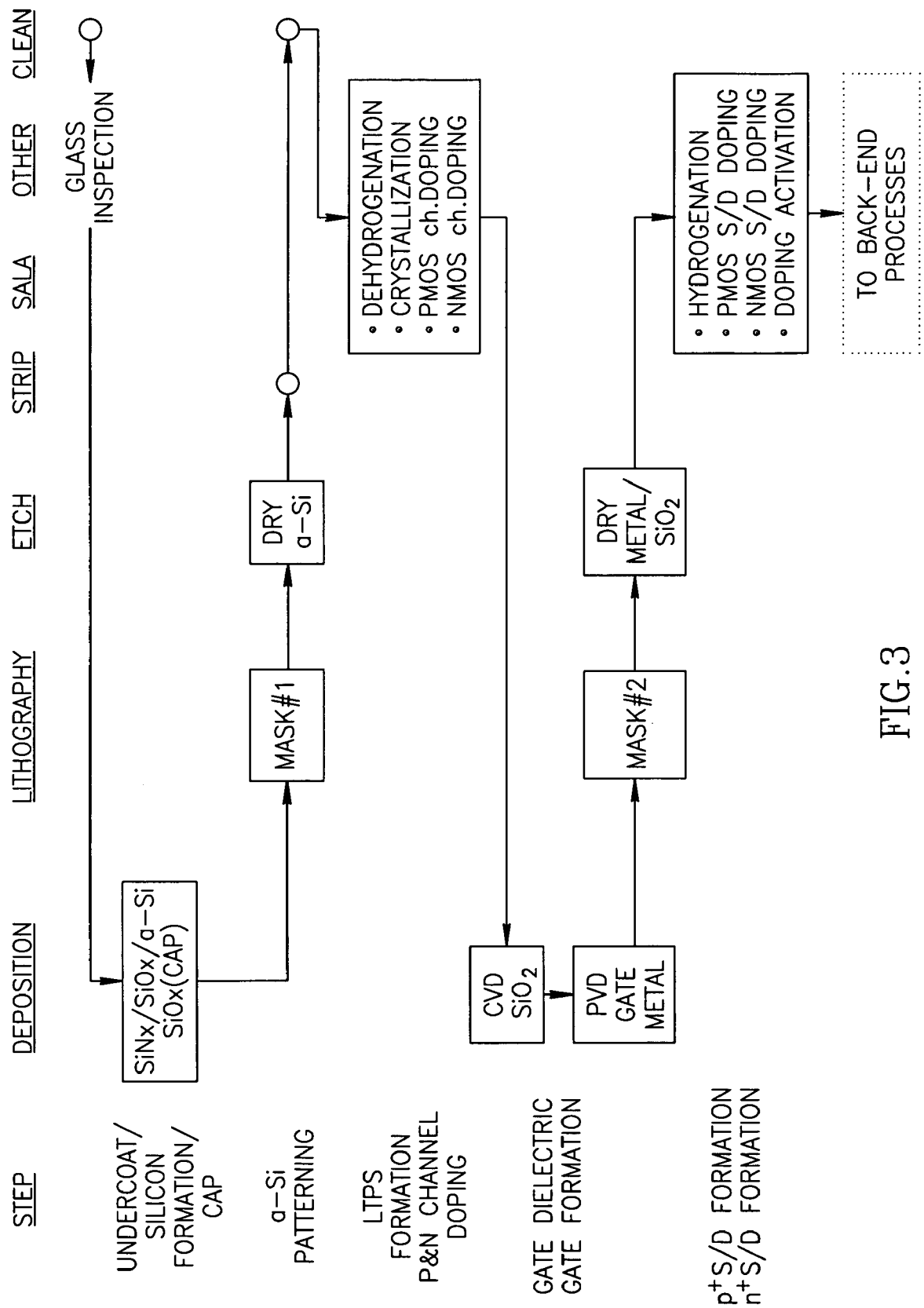
FIG. 3 is a simplified flow chart showing principal operations in the manufacture of an array of thin film transistors in accordance with an embodiment of the present invention.

Reference is now made to FIG. 3 which is a simplified flow chart showing operations in the manufacture of an array of thin film transistors in accordance with a non-limiting embodiment of the present invention. In FIG. 3 the principal process stages are shown along the vertical axis, while process stations in process equipment employing the system shown in FIG. 1 are shown along the horizontal axis.

The manufacture of a TFT substrate in accordance with an illustrative embodiment of the invention commences with cleaning and inspecting the substrate. An undercoat of amorphous silicon (a cap) is applied to the substrate.

In accordance with an embodiment of the invention, the amorphous silicon is patterned using conventional photolithography techniques comprising, for example, exposure of a photoresist in a desired pattern using a first mask, etching, the amorphous silicon and then striping and cleaning the substrate to leave an array of a multiplicity of amorphous thin film silicon deposits.

Subsequently a low temperature poly-silicon (LTPS) process is performed on the amorphous silicon deposits using a selectable area laser assisted (SALA) laser processing system, such as system 10 described with respect to FIG. 1. Laser beams are delivered to the substrate to dehydrogenate and then crystallize the thin film amorphous silicon deposits. PMOS channels and subsequently NMOS channels are doped in a laser assisted treatment process, each under the appropriate suitable gaseous environmental condition in a process chamber such as chamber 32 (FIG. 1).

Next the TFF substrate is removed from the laser treatment process chamber for gate dielectric and gate formation. $SiO_2$ is deposited on the substrate, for example using a chemical-vapor, other suitable, deposition process, and subsequently gate metal is deposited. A photolithography operation employing a second mask is performed along with an etch process to provide transistor interconnects.

The TFT substrate is returned to a SALA process chamber whereat the thin film transistor locations are hydrogenated, PMOS source/drains and NMOS source/drains are doped at each of the thin film transistor locations, and the doping is activated. The TFT substrate is then passed on to additional processing for back end processes.

The above and other features of the invention including various and novel method steps and system elements have been particularly described with reference to the accompanying drawings and pointed out in the claims. It will be understood that the particular fabrication method and elements of the system embodying the invention is shown by way of illustration only and not as a limitation of the invention. The principles and features of this invention may be employed in varied and numerous embodiments without departing from the scope of the invention.

The invention claimed is:

1. A method of fabricating thin film transistors, comprising:
   forming at least one semi-conductive film on a substrate;
   immersing said substrate in a dopant; and
   independently tilting a plurality of tiltable beam steering elements to deliver a laser beam to a plurality of independently selectable location on said substrate to induce a doping reaction between said dopant and said semi-conductive film at said independently selectable locations.

2. The method claimed in claim 1, wherein said semi-conductive film comprises a semiconductor film.

3. The method claimed in claim 1, wherein said semi-conductive film comprises silicon.

4. The method claimed in claim 3, wherein said semi-conductive film is deposited on an insulating substrate.

5. The method claimed in claim 4, and wherein said insulating substrate comprises glass.

6. The method claimed in claim 1, wherein said locations correspond to locations whereat transistors are to be formed in said semi-conductive film.

7. The method claimed in claim 1, wherein said immersing said substrate comprises showering ionized molecules onto said substrate.

8. The method claimed in claim 1, wherein said independently tilting a plurality of tiltable beam steering elements to deliver a laser beam includes splitting a first laser beam into a plurality of sub-beams, and tilting said plurality of tiltable beam steering elements to direct said sub-beams to mutually independently selectable locations.

9. The method claimed in claim 1, wherein said independently tilting a plurality of tiltable beam steering elements to deliver a laser beam is performed so as to deliver said laser beam to said selectable locations that are at least partially isolated from other said selectable locations.

10. The method claimed in claim 1, wherein said independently tilting a plurality of tiltable beam steering elements to deliver a laser beam is performed so as to deliver said laser beam to said selectable locations that vary from other said selectable locations in size.

11. The method claimed in claim 1, wherein said independently tilting a plurality of tiltable beam steering elements to deliver a laser beam is performed so as to deliver said laser beam to said selectable locations that vary from other said selectable locations in spacing.

12. The method claimed in claim 1, wherein said delivering a laser beam comprises modulating an energy characteristic of said laser beam.

13. The method claimed in claim 12, wherein said delivering a laser beam comprises delivering said laser beam with a first modulated energy characteristic to a first independently selectable location, and then delivering said laser beam with a second modulated energy characteristic to a second independently selectable location.

14. The method claimed in claim 1, wherein said delivering a laser beam comprises delivering a pulsed laser beam having a pulse repetition rate of greater than 5 KHz.

15. The method claimed in claim 1, further comprising individually heating each of said selectable locations to at least partially melt said conductive film thereat.

16. The method claimed in claim 1, wherein said independently tilting a plurality of tiltable beam steering elements to deliver a laser beam comprises selecting locations during operation of a laser supplying said laser beam.

17. The method claimed in claim 1, wherein said independently tilting a plurality of tiltable beam steering elements to deliver a laser beam comprises selecting locations during performing a doping reaction induction operation on said conductive film.

18. The method claimed in claim 1, wherein said independently tilting a plurality of tiltable beam steering elements to deliver a laser beam comprises delivering said laser beam to said independently selectable locations without an intervening photo mask.

19. The method claimed in claim 18, wherein said selecting of said independently selectable locations is performed during operation of a laser supplying said laser beam.

20. A method of producing thin film transistors on a substrate, comprising:
generating a laser beam;
splitting said laser beam into a plurality of selectably positionable sub-beams;
directing said sub-beams to a plurality of tiltable beam steering elements; and
independently tilting ones of the plurality of tiltable beam steering elements, thereby directing each of said sub-beams to selectable areas on said substrate said selectable areas corresponding to locations whereat said transistors are to be formed, in the presence of a doping gas to induce a doping reaction between said substrate and said doping gas at said selectable areas.

21. The method according to claim 20, wherein each of said selectable areas is at least partially isolated from another one of said selectable areas.

22. The method according to claim 20, wherein at least one of said selectable areas vary from each other in size and spacing.

23. The method according to claim 20, wherein said laser beam is a pulsed laser beam having a pulse repetition rate of greater than 5 KHz.

24. The method according to claim 20, wherein said sub-beams are independently guided, by the plurality of tiltable beam steering elements, so as to interact with said doping gas and with said substrate surface, at each of said selectable areas.

25. The method according to claim 20, further comprising individually heating each of said selectable areas thereby forming bases of said transistors.

26. A method of manufacturing an array of thin film transistors, comprising:
depositing amorphous silicon on a substrate;
providing a plurality of tiltable beam steering elements;
independently tilting the plurality of tiltable beam steering elements to direct laser sub-beams to selectable locations on the substrate;
crystallizing said amorphous silicon to amorphous silicon at the selectable locations with the laser energy of the sub-beams and
applying P type doping to portions of crystallized silicon by delivering the laser energy of the sub-beams to a plurality of selectable locations in presence of a P type doping agent.

27. The method claimed in claim 26, wherein said applying P type doping comprises forming PMOS channels.

28. The method claimed in claim 26, further comprising: applying N type doping to portions of crystallized silicon by delivering said laser energy to said plurality of selectable locations in presence of an N type doping agent.

29. The method claimed in claim 28, wherein said applying N type doping comprises forming NMOS channels.

30. The method claimed in claim 27, further comprising: applying N type doping to portions of crystallized silicon by delivering laser energy to said plurality of selectable locations in presence of an N type doping agent.

31. The method claimed in claim 30, wherein said applying N type doping comprises forming NMOS channels.

32. The method claimed in claim 31, further comprising forming dielectric gates.

33. The method claimed in claim 31, further comprising: laser treating crystallized silicon at said selectable locations to hydrogenate said selectable locations.

34. The method claimed in claim 32, further comprising: laser treating said selectable locations in said crystallized silicon in the presence of said P doping agent to form PMOS type source/drains.

35. The method claimed in claim 34, further comprising: laser treating selected areas in said crystallized silicon in the presence of said N doping agent to form NMOS type source/drains.

36. The method claimed in claim 26, wherein at least one of dehydrogenating, crystallizing said silicon, doping and hydrogenating is performed without masking.

* * * * *